United States Patent
Ito

(10) Patent No.: US 9,142,591 B2
(45) Date of Patent: Sep. 22, 2015

(54) METHOD FOR MEASURING ELECTRONIC MULTIPLICATION FACTOR

(75) Inventor: Katsuhide Ito, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 329 days.

(21) Appl. No.: 13/696,886

(22) PCT Filed: Mar. 7, 2011

(86) PCT No.: PCT/JP2011/055258
§ 371 (c)(1),
(2), (4) Date: Nov. 8, 2012

(87) PCT Pub. No.: WO2011/142168
PCT Pub. Date: Nov. 17, 2011

(65) Prior Publication Data
US 2013/0070088 A1    Mar. 21, 2013

(30) Foreign Application Priority Data

May 14, 2010    (JP) ................................ 2010-112209

(51) Int. Cl.
| G01R 19/00 | (2006.01) |
| H01L 27/148 | (2006.01) |
| H04N 5/361 | (2011.01) |
| H04N 5/372 | (2011.01) |
| H04N 5/3725 | (2011.01) |

(52) U.S. Cl.
CPC .......... *H01L 27/14831* (2013.01); *H04N 5/361* (2013.01); *H04N 5/3725* (2013.01); *H04N 5/37213* (2013.01)

(58) Field of Classification Search
CPC .................................................. G01R 19/0061
See application file for complete search history.

(56) References Cited

FOREIGN PATENT DOCUMENTS

| EP | 1688960 | 8/2006 |
| EP | 1819145 | 8/2007 |
| EP | 1983739 | 10/2008 |
| JP | 2003-9000 | 1/2003 |

(Continued)

OTHER PUBLICATIONS

Robbins, Mark, "The Noise Performance of Electron Multiplying Charge Coupled Device", IEEE Transactions on Electronic Devices, vol. 50, No. 5, May 2003. p. 1227-1232.*

(Continued)

*Primary Examiner* — Sath V Perungavoor
*Assistant Examiner* — Jeffery Williams
(74) *Attorney, Agent, or Firm* — Drinker Biddle & Reath LLP

(57) ABSTRACT

In an electron multiplying imaging device 1 with a solid-state image pickup device 10, a first multiplied image of incident light with a first light amount and a second multiplied image of incident light with a second light amount are acquired at a predetermined electron multiplication factor set in advance, and a luminance average value and a luminance variance average value of pixels included in the first multiplied image and a luminance average value and a luminance variance average value of pixels included in the second multiplied image are calculated. By using the calculated luminance average values and luminance variance average values, a conversion factor of the first and second multiplied images is calculated, and by using the calculated conversion factor and a conversion factor at a reference electron multiplication factor held in advance, an actual electron multiplication factor of the solid-state image pickup device 10 is calculated.

5 Claims, 8 Drawing Sheets

(56) References Cited

FOREIGN PATENT DOCUMENTS

| | | |
|---|---|---|
| JP | 2003-158679 | 5/2003 |
| JP | 2006-203222 | 8/2006 |
| JP | 2006-324614 | 11/2006 |
| JP | 2007-124675 | 5/2007 |
| JP | 2008-271049 | 11/2008 |

OTHER PUBLICATIONS

Robbins M. S. et al., "The Noise Performance of Electron Multiplying Charge-Coupled Devices", IEEE Transactions on Electron Devices, IEEE Service Center, Pisacataway, NJ, US, vol. 50, No. 5, May 1, 2003, p. 1227-p. 1232, XP011072658.

Jaroslav Hynecek, "Impactron-A New Solid State Image Intensifier", IEEE Transactions on Electron Devices, IEEE Service Center, Pisacataway, NJ, US, vol. 48, No. 10, Oct. 1, 2001, p. 2238, XP011017812.

Michael J. Deweert, "Photon Transfer Methods and Results for Electron Multiplication CCDs," Proceedings of SPIE, 2004, pp. 248-259, vol. 5558.

* cited by examiner

Fig.4
(a)
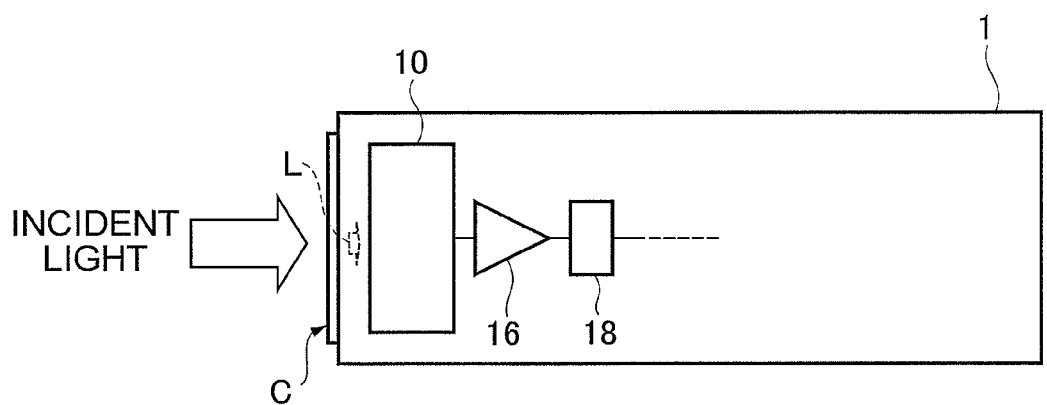
(b)
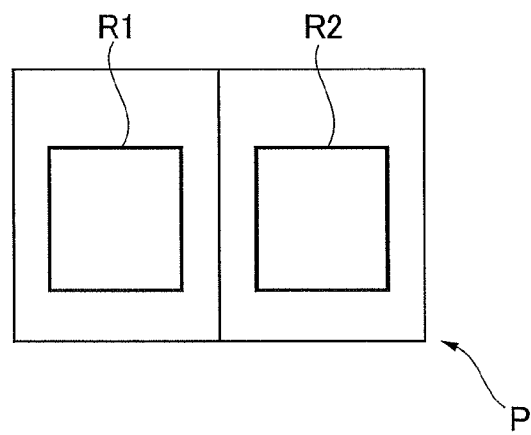

*Fig.6*
(a)
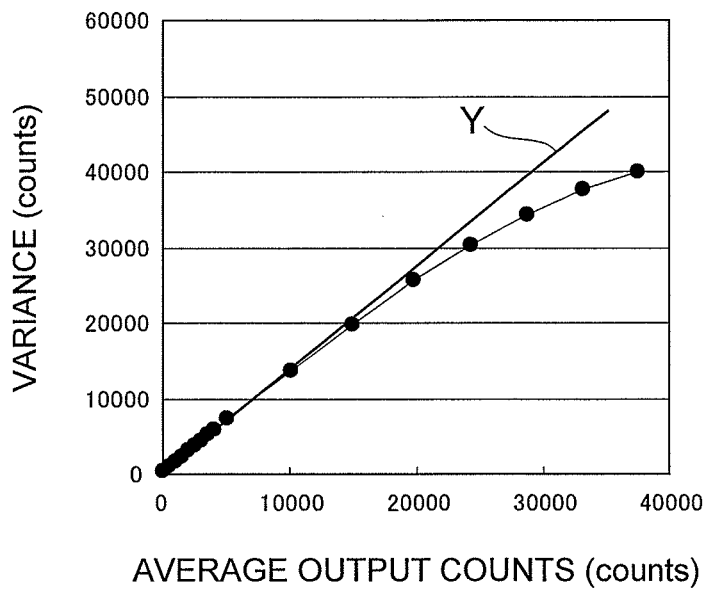
(b)
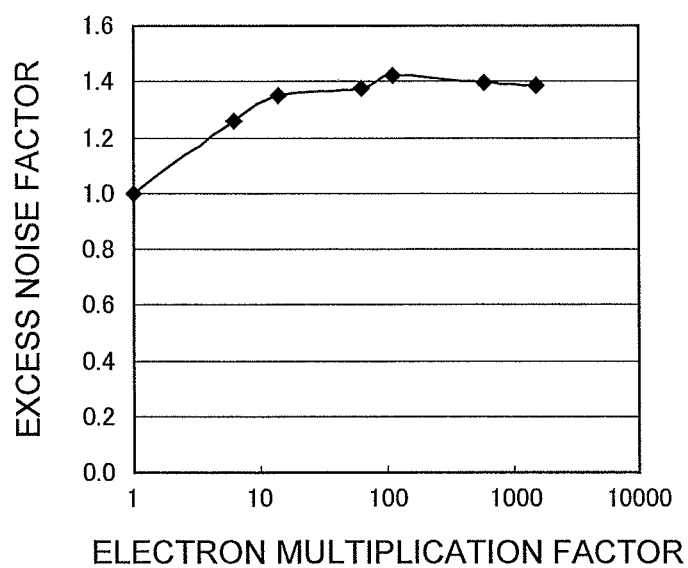

Fig.7

| ELECTRON MULTIPLICATION FACTOR | EXCESS NOISE FACTOR |
|---|---|
| 1 OR LESS | 1.0 |
| 1 TO 3 OR LESS | 1.1 |
| 3 TO 5 OR LESS | 1.2 |
| 5 TO 10 OR LESS | 1.3 |
| 10 OR MORE | 1.4 |

METHOD FOR MEASURING ELECTRONIC MULTIPLICATION FACTOR

TECHNICAL FIELD

The present invention relates to a method for measuring an electron multiplication factor in an imaging device with an electron multiplying image pickup device.

BACKGROUND ART

As a conventional imaging device, one with a CMD (Charge Multiplying Detector)-CCD image pickup device including a charge multiplying means is known. In such an imaging device, due to deterioration, etc., of this device, a difference may occur between a multiplication factor that a user sets and an actual multiplication factor in an imaged multiplied image. Therefore, a method is known in which in such an imaging device, a first signal value imaged with pixels corresponding to a shading region of the CMD-CCD image pickup device and multiplied by a multiplication factor of 1 is stored, and further, a second signal value imaged with pixels corresponding to the shading region and multiplied by a predetermined multiplication factor is stored, and by dividing the second signal value by the first signal value, an actual multiplication factor is calculated (for example, refer to Patent Document 1).

CITATION LIST

Patent Literature

Patent Document 1: Japanese Patent Application Laid-Open No. 2003-9000

SUMMARY OF INVENTION

Technical Problem

In the above-described imaging device, a method for measuring an electron multiplication factor by which a multiplication factor can be accurately and easily measured has been demanded.

Therefore, an object of the present invention is to provide a method for measuring an electron multiplication factor by which an electron multiplication factor can be accurately and easily measured.

Solution to Problem

To achieve the above-described object, a method for measuring an electron multiplication factor according to the present invention is a method for measuring an electron multiplication factor in an imaging device with an electron multiplying image pickup device, and includes a first step of acquiring a first multiplied image of incident light with a first light amount and a second multiplied image of incident light with a second light amount different from the first light amount at a predetermined electron multiplication factor set in advance, a second step of calculating a luminance average value and a luminance variance average value of the pixels included in the first multiplied image, a third step of calculating a luminance average value and a luminance variance average value of the pixels included in the second multiplied image, a fourth step of calculating a conversion factor of the first and second multiplied images by using the luminance average values and the luminance variance average values calculated in the second and third steps, and a fifth step of obtaining an electron multiplication factor of the first and second multiplied images by using the conversion factor calculated in the fourth step and a conversion factor at a reference electron multiplication factor.

By this method for measuring an electron multiplication factor, at a predetermined electron multiplication factor, first and second multiplied images of incident lights with light amounts different from each other are acquired, luminance average values and luminance variance average values of pixels included in the acquired first and second multiplied images are calculated, and a conversion factor of the first and second multiplied images is calculated by using the calculated luminance average values and luminance variance average values, and then an electron multiplication factor of the first and second multiplied images is obtained by using the calculated conversion factor. Thus, in this method for measuring an electron multiplication factor, an electron multiplication factor is obtained by using two multiplied images with luminances different from each other. Therefore, by this method for measuring an electron multiplication factor, an electron multiplication factor can be accurately and easily measured.

Preferably, the method for measuring an electron multiplication factor according to the present invention further includes a step of correcting the electron multiplication factor obtained in the fifth step by using an excess noise factor corresponding to the electron multiplication factor. In this case, the obtained electron multiplication factor is corrected by using an excess noise factor corresponding to this electron multiplication factor, so that a more accurate electron multiplication factor can be obtained.

Further, in the method for measuring an electron multiplication factor according to the present invention, it is preferable that, in the first step, third and fourth multiplied images imaged at times different from each other are acquired as a first multiplied image and fifth and sixth multiplied images imaged at times different from each other are acquired as a second multiplied image, in the second step, a luminance average value of pixels included in the first multiplied image is calculated based on an added image of the third multiplied image and the fourth multiplied image, and a luminance variance average value of pixels included in the first multiplied image is calculated based on a subtracted image of the third multiplied image and the fourth multiplied image, and in the third step, a luminance average value of pixels included in the second multiplied image is calculated based on an added image of the fifth multiplied image and the sixth multiplied image, and a luminance variance average value of pixels included in the second multiplied image is calculated based on a subtracted image of the fifth multiplied image and the sixth multiplied image. In this case, each of the first and second multiplied images includes two multiplied images imaged at different times. Then, in this method for measuring an electron multiplication factor, luminance average values and luminance variance average values of the first and second multiplied images are calculated based on two multiplied images. Therefore, accurate luminance average values and luminance variance average values can be obtained. In particular, a luminance variance average value is calculated based on a subtracted image of the two images, so that influences of shading of this imaging device are reduced and the luminance variance average value becomes accurate.

Advantageous Effects of Invention

The present invention provides a method for measuring an electron multiplication factor by which an electron multiplication factor can be accurately measured.

BRIEF DESCRIPTION OF DRAWINGS

FIG. 4(a) is a view showing shading and dimming of incident light by using a cap, and FIG. 4(b) is a view showing an example of a multiplied image with bright and dark portions.

FIG. 6(a) is a graph showing an example of a relationship between the luminance average value and the luminance variance average value, and FIG. 6(b) is a graph showing an example of a relationship between the electron multiplication factor and the excess noise factor.

FIG. 7 is an example of a table associating the electron multiplication factor with the excess noise factor.

DESCRIPTION OF EMBODIMENTS

Figure 1:
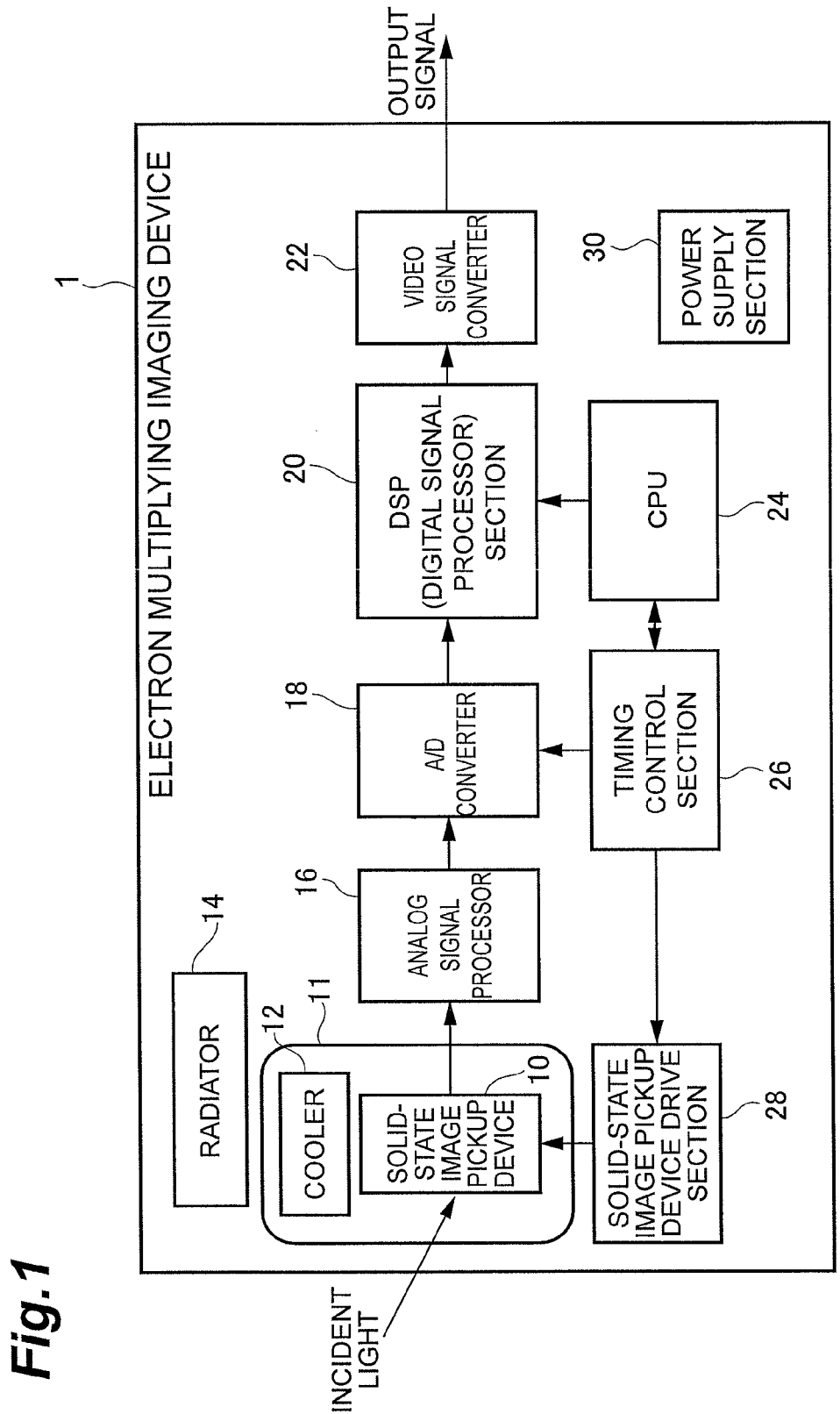
FIG. 1 is a block diagram showing a configuration of an electron multiplying imaging device according to the present embodiment.

Hereinafter, a preferred embodiment of the present invention is described in detail with reference to the drawings. In the drawings, portions identical or equivalent to each other are provided with the same reference symbol, and overlapping description is omitted.

As shown in FIG. 1, an electron multiplying imaging device 1 includes an electron multiplying solid-state image pickup device (electron multiplying image pickup device) 10. This solid-state image pickup device 10 includes a plurality of pixels arrayed to output charge signals generated according to light amounts of incident light in the pixels, and an electron multiplication section that multiplies the charge signals.

Figure 2:
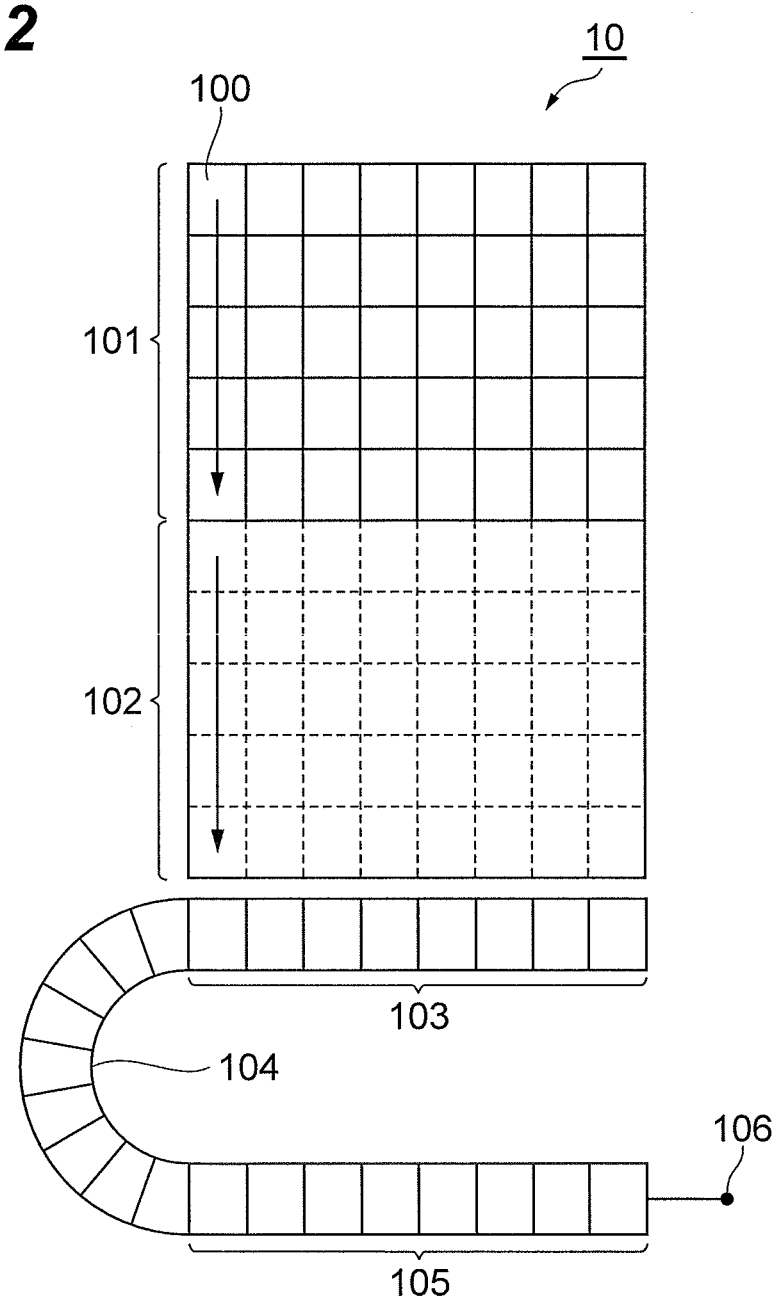
FIG. 2 is a schematic view showing an example of a configuration of the solid-state image pickup device shown in FIG. 1.

As shown in FIG. 2, the solid-state image pickup device 10 is configured as an FT (frame transfer) type CCD that includes an imaging section 101 and an accumulation section 102 consisting of vertical shift registers, and a horizontal shift register 103. The imaging section 101 to be used for image acquisition based on incident light images has a structure in which unit pixels 100 are two-dimensionally arrayed.

The accumulation section 102 has a structure in which unit pixels are two-dimensionally arrayed as in the imaging section 101. The accumulation section 102 is provided between the imaging section 101 and the horizontal shift register 103. This accumulation section 102 is masked with opaque metal, etc., and is not used to detect light images, but is used to accumulate charge signals generated in the unit pixels 100 of the imaging section 101 and transfer the charge signals to the horizontal shift register 103.

In the solid-state image pickup device 10 thus configured, first, when a light image is made incident on the imaging section 101, the image is acquired by generating charge signals corresponding to the incident light in the respective pixels 100. Next, the charge signals generated in the pixels 100 of the imaging section 101 are accumulated in the accumulation section 102. Subsequently, the charge signals are read out by the horizontal shift register 103 being an output register.

The solid-state image pickup device 10 is provided with a multiplication register 105 being an electron multiplication section having an electron multiplication function in addition to the horizontal shift register 103. Accordingly, this solid-state image pickup device 10 is configured as an electron multiplying CCD (EM-CCD) capable of multiplying charge signals by a predetermined electron multiplication factor by transferring the charge signals while applying a voltage as an electron multiplication voltage higher than normal to the multiplication register 105. With this configuration, charge signals transferred from the pixels 100 of the imaging section 101 to the horizontal shift register 103 are further transferred to the multiplication register 105 via a connecting register 104, and accordingly, the charge signals are multiplied by the predetermined electron multiplication factor, and the obtained multiplied charge signals are output as image data from an output terminal 106.

Here, as shown in FIG. 1, the electron multiplying imaging device 1 further includes a cooler 12 and a radiator 14. The cooler 12 keeps the solid-state image pickup device 10 in a state cooled to a predetermined temperature so as to reduce dark current noise, etc. The radiator 14 is connected to the heat release side of the cooler 12, and performs radiation by convection caused by using a fan or water circulation. The cooler 12 and the solid-state image pickup device 10 are sealed inside a vacuum sealed tube 11.

The electron multiplying imaging device 1 further includes an analog signal processor 16, an A/D converter 18, a DSP (digital signal processor) section 20, and a video signal converter 22. The analog signal processor 16 applies necessary signal processing to analog charge signals output from the solid-state image pickup device 10. Signal processing to be performed by the analog signal processor 16 is, for example, direct current restoration of analog video signals (charge signals) output from the solid-state image pickup device 10 and amplification of the analog video signals for obtaining amplitude suitable for subsequent A/D conversion.

The A/D converter 18 converts analog video signals output from the analog signal processor 16 into digital video signals and outputs these to the subsequent DSP section 20. The DSP section 20 applies signal processing to the digital video signals output from the A/D converter 18 and outputs these to the subsequent video signal converter 22. The video signal converter 22 adds horizontal and vertical video synchronization signals to the digital video signals being image data output from the DSP section 20 to generate digital video signals as output signals to be output to the outside from the electron multiplying imaging device 1.

The electron multiplying imaging device 1 further includes a CPU 24, a timing control section 26, and a solid-state image pickup device drive section 28. The CPU 24 is a CPU for executing imaging control processing, and controls operations of the respective components such as the DSP section 20, the timing control section 26, and the solid-state image pickup device drive section 28 of the electron multiplying imaging device 1. The CPU 24 executes processings of the method for measuring an electron multiplication factor described later by performing predetermined arithmetic operations.

The timing control section 26 generates and outputs timing signals necessary for operations of the solid-state image pickup device 10 and the A/D converter 18, etc. The solid-state image pickup device drive section 28 performs control of charge transfer in the imaging section 101, the accumulation section 102 and the registers 103 to 105, and control of conditions of the electron multiplication voltage for the multiplication register 105, etc., by referring to timing signals from the timing control section 26 and command signals from the CPU 24, etc. Voltages necessary for operations of the respective components of the electron multiplying imaging device 1 are supplied from a power supply section 30.

Figure 3:
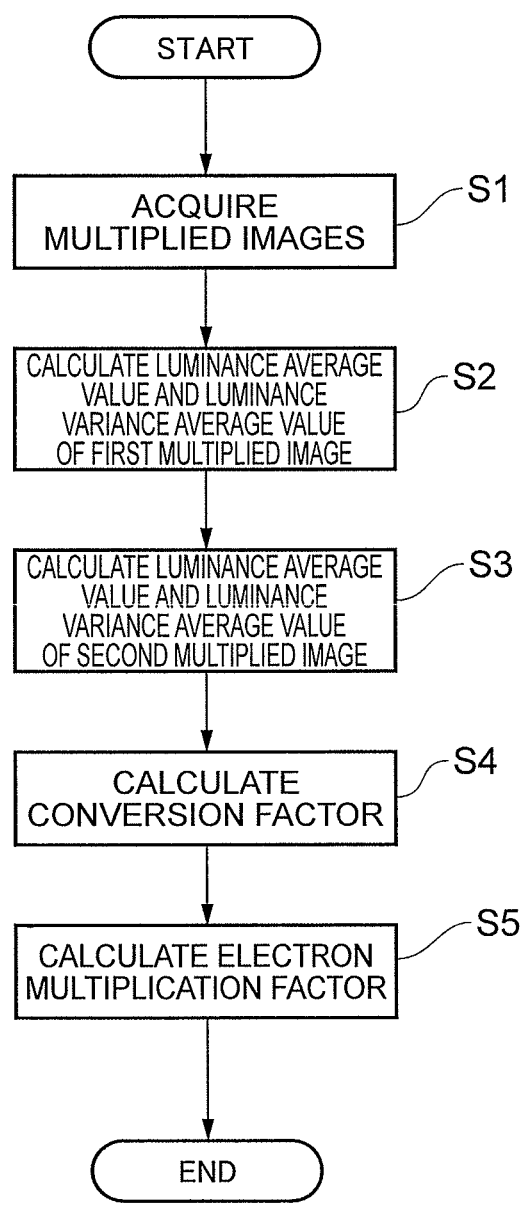
FIG. 3 is a flowchart showing steps of a method for measuring an electron multiplication factor in the electron multiplying imaging device shown in FIG. 1

Next, a method for measuring an electron multiplication factor in the electron multiplying imaging device 1 is described with reference to FIG. 3. This measurement method is performed by properly controlling the components of the electron multiplying imaging device 1 and carrying out predetermined arithmetic operations by the CPU 24.

First, at a predetermined electron multiplication factor set in advance, a first multiplied image of incident light with a first light amount and a second multiplied image of incident light with a second light amount different from the first light amount are acquired (first step S1). In detail, multiplied charge signals generated in the solid-state image pickup device 10 according to the incident light with the first light amount are subjected to signal processing in the analog signal processor 16 and then converted into digital signals by the A/D converter 18, and stored as a first multiplied image in a memory of the DSP section 20, and multiplied charge signals generated in the solid-state image pickup device 10 according to the incident light with the second light amount are subjected to signal processing in the analog signal processor 16 and then converted into digital signals by the A/D converter 18 and stored as a second multiplied image in the memory of the DSP section 20.

At this time, it is possible that one of the first multiplied image and the second multiplied image is set as a multiplied image of incident light L shaded or dimmed by, for example, the cap C as shown in FIG. 4(*a*), and the other of the first multiplied image and the second multiplied image is set as a multiplied image of normal (not-shaded or not-dimmed) incident light.

Alternatively, for example, as shown in FIG. 4(*b*), it is also possible that a subject whose relatively bright region and dark region can be simultaneously reflected in one image is prepared, and one of the first multiplied image and the second multiplied image is a relatively dark image region (image region made by incident light with a relatively small light amount) R1 in one multiplied image P, and the other of the first multiplied image and the second multiplied image is a relatively bright image region (image region made by incident light with a relatively large light amount) R2 in the one multiplied image.

The first light amount and the second light amount are preferably uniform with respect to each pixel 100. If the first light amount and the second light amount are not uniform with respect to each pixel 100, as described later, as each of the first multiplied image and the second multiplied image, a plurality of multiplied images are preferably imaged and acquired at different (if possible, successive) times.

Subsequently, a luminance average value (average output counts) and a luminance variance average value (variance of average output counts) of pixels included in the first multiplied image acquired in the first step S1 are calculated (second step S2). Here, when the first light amount is uniform with respect to each pixel 100, the luminance average value and the luminance variance average value calculated in this second step become more accurate. Hereinafter, the luminance average value and the luminance variance average value calculated in this second step S2 may be referred to as a first luminance average value and a first luminance variance average value, respectively.

Subsequently, a luminance average value and a luminance variance average value of pixels included in the second multiplied image acquired in the first step S1 are also calculated (third step S3). Here, if the second light amount is uniform with respect to each pixel 100, the luminance average value and the luminance variance average value calculated in this third step become more accurate. Hereinafter, the luminance average value and the luminance variance average value calculated in this third step S3 may be referred to as a second luminance average value and a second luminance variance average value, respectively.

Subsequently, by using the luminance average values and luminance variance average values calculated in the second step S2 and the third step S3, a conversion factor of the first multiplied image and the second multiplied image acquired in the first step S1 is calculated (fourth step S4). Here, the conversion factor is a coefficient showing how many photoelectrons the output counts of 1 is equivalent of, and can be obtained as follows.

It is known that the luminance variance average value is expressed as a linear function of the luminance average value as expressed by the following formula.

$$V(I)=(1/CF)\times(I-\text{offset})+r^2/CF^2$$ [Numerical formula 1]

Figure 5:
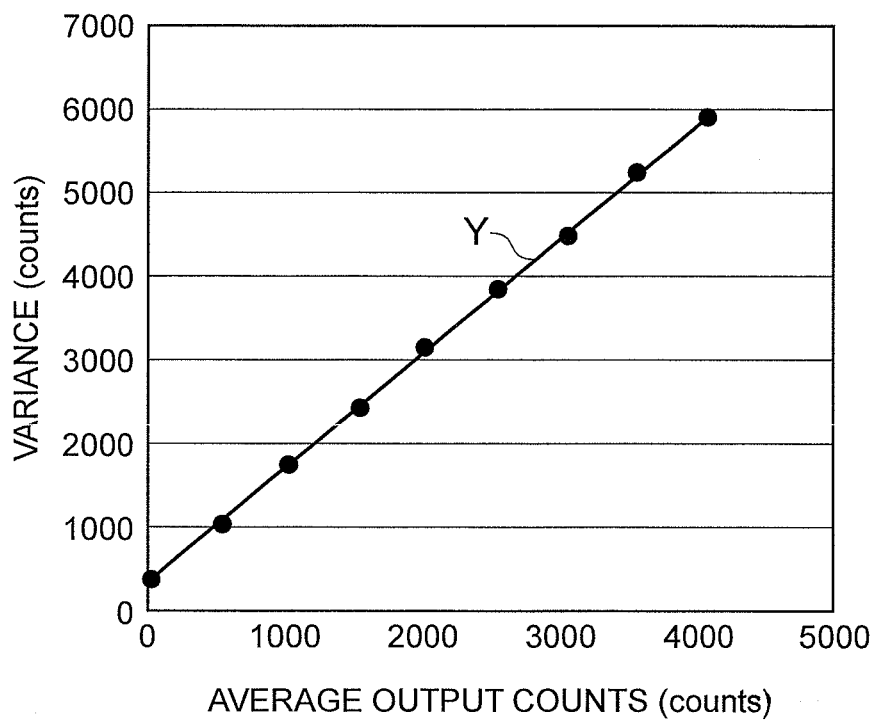
FIG. 5 is a graph showing an example of a relationship between the luminance average value and the luminance variance average value.

Here, V(I) is a luminance variance average value, CF is a conversion factor, I is a luminance average value, and r is a readout noise. According to the above-described formula, the slope of the luminance variance average value V(I) (coefficient of the luminance average value I) is the reciprocal of the conversion factor CF. FIG. 5 is a diagram in which luminance average values and luminance variance average values in a plurality of images are plotted by way of example. In FIG. 5, the straight line Y connecting the respective points is substantially the luminance variance average value V(I) of the above-described formula.

Therefore, by obtaining the slope of this straight line Y and calculating the reciprocal thereof, a conversion factor is obtained. The slope of the straight line Y is obtained from luminance average values and luminance variance average values of two multiplied images of incident lights with light amounts different from each other (with luminances different from each other). Specifically, when the first luminance average value and the first luminance variance average value calculated in the second step S2 are defined as Ia and Va, respectively, and the second luminance average value and the second luminance variance average value calculated in the third step S3 are defined as Ib and Vb, respectively, the conversion factor CF can be obtained by the following formula.

$$CF=(Ia-Ib)/(Va-Vb)$$ [Numerical formula 2]

Subsequently, by using the conversion factor calculated in the fourth step S4 as described above and a conversion factor at a reference electron multiplication factor (for example, 1) held in advance, a net electron multiplication factor of the first and second multiplied images acquired in the first step S1 (that is, a net electron multiplication factor of the solid-state image pickup device 10) is calculated (fifth step S5). This net electron multiplication factor can be obtained by the following formula according to the knowledge of the inventors.

Net electron multiplication factor=Conversion factor at reference electron multiplication factor/Conversion factor at net electron multiplication factor [Numerical formula 3]

Here, the conversion factor at the net electron multiplication factor of the above-described formula is the conversion factor calculated in the fourth step S4. Through the above-described steps, an actual electron multiplication factor of the first and second multiplied images acquired at the predetermined electron multiplication factor set in advance is obtained. The obtained electron multiplication factor may be output as a numerical value in real time or output together with image data.

As described above, in this method for measuring an electron multiplication factor, first and second multiplied images of incident lights with light amounts different from each other are acquired at a predetermined electron multiplication factor set in advance, luminance average values and luminance variance average values of pixels included in the acquired first and second multiplied images are calculated, a conversion factor of the first and second multiplied images is calculated by using the calculated luminance average values and luminance variance average values, and then an electron multiplication factor of the first and second multiplied images is obtained by using the calculated conversion factor. Thus, in this method for measuring an electron multiplication factor, an electron multiplication factor is obtained by using two multiplied images with luminances different from each other. Therefore, by this method for measuring an electron multiplication factor, an electron multiplication factor can be accurately and easily obtained.

Here, the linearity between the luminance average value and the luminance variance average value deteriorates as the luminance average value increases as shown in FIG. 6(a). Therefore, it is preferable that luminance average values with poor linearity are measured in advance, and a maximum luminance average value is set so as not to obtain an electron multiplication factor at the luminance average values with poor linearity. In this case, an electron multiplication factor is prevented from being obtained at luminance average values with poor linearity exceeding the maximum luminance average value, so that an electron multiplication factor can be accurately obtained.

To obtain a more accurate electron multiplication factor, an excess noise factor must be considered. The excess noise factor shows multiplication fluctuation that occurs when multiplying electrons. It is known that such an excess noise factor changes according to changes in electron multiplication factor (refer to, for example, "Photon Transfer Methods and Results for Electron Multiplication CCDs, Proceedings of SPIE Vol. 5558, pp. 248-259"). An example of a change in excess noise factor according to a change in electron multiplication factor is shown in FIG. 6(b). Referring to FIG. 6(b), the excess nose factor is 1.0 when the electron multiplication factor is 1, and the excess noise factor increases as the electron multiplication factor increases, and becomes substantially 1.4 when the electron multiplication factor is 10 or more.

Therefore, preferably, the method for measuring an electron multiplication factor according to the present embodiment further includes a step of correcting the electron multiplication factor obtained in the fifth step S5 by the excess noise factor corresponding to the electron multiplication factor as a step subsequent to the fifth step S5. In this case, by dividing the electron multiplication factor obtained in the fifth step S5 by an excess noise factor corresponding to the electron multiplication factor, a corrected electron multiplication factor can be obtained. By performing this correction, an actual electron multiplication factor of the first and second multiplied images acquired in the first step S1 can be accurately obtained. A table associating the electron multiplication factor with the excess noise factor as shown in FIG. 7 is held in advance and the correction is performed by referring to the table, and accordingly, more efficient correction of the electron multiplication factor can be performed.

Figure 8:
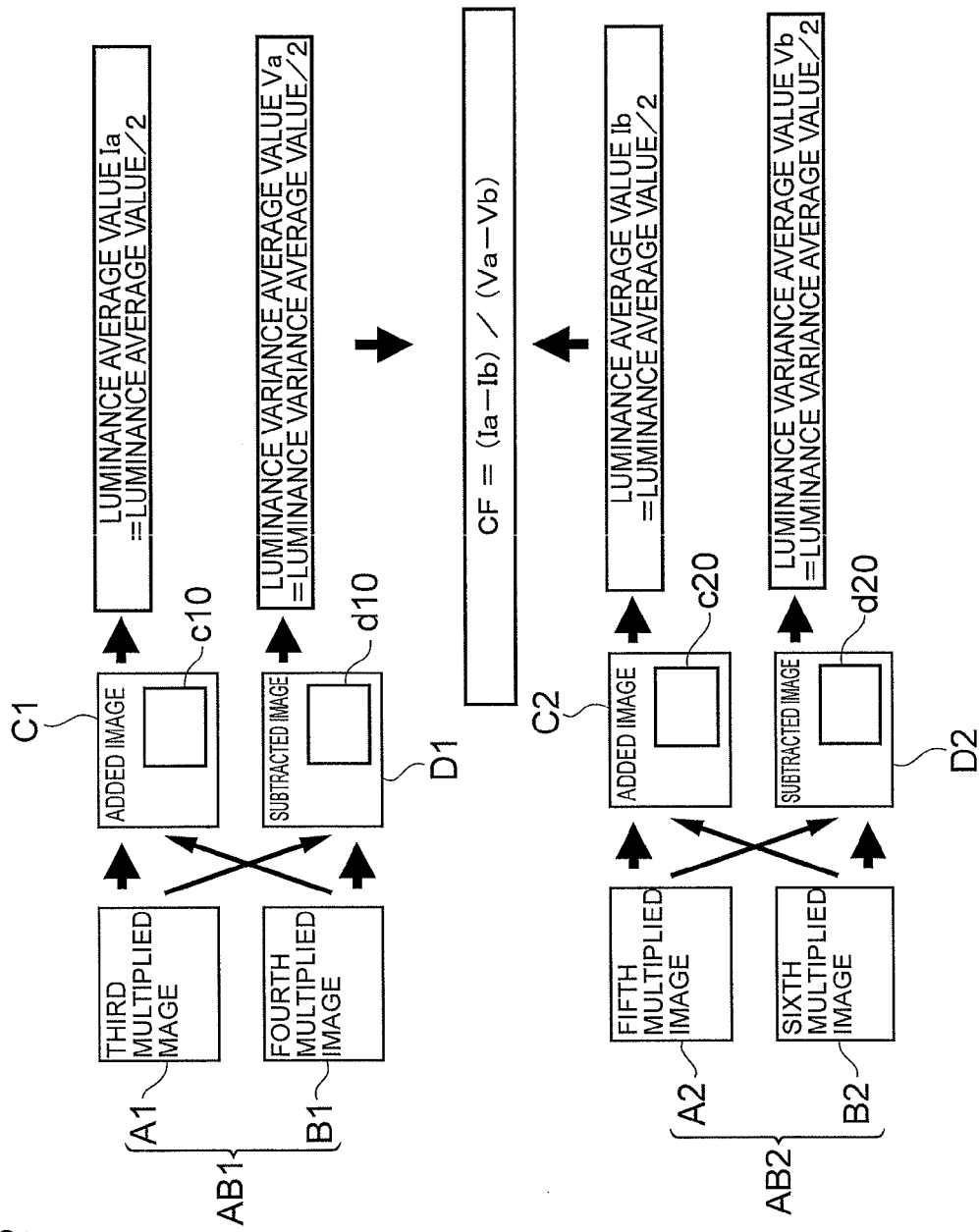
FIG. 8 is a diagram showing other steps of a method for measuring an electron multiplication factor according to the present embodiment.

In the method for measuring an electron multiplication factor according to the present embodiment, in the first step S1, as shown in FIG. 8, a third multiplied image A1 and a fourth multiplied image B1 imaged at times different from each other can be acquired as a first multiplied image AB1, and a fifth multiplied image A2 and a sixth multiplied image B2 imaged at times different from each other can be acquired as a second multiplied image AB2. At this time, an added image C1 and a subtracted image D1 of the third multiplied image A1 and the fourth multiplied image B1 are generated and stored in the memory of the DSP section 20, and an added image C2 and a subtracted image D2 of the fifth multiplied image A2 and the sixth multiplied image B2 are generated and stored in the memory of the DSP section 20. The third multiplied image A1 and the fourth multiplied image B1 are images of incident light with a first light amount, and the fifth multiplied image A2 and the sixth multiplied image B2 are images of incident light with a second light amount. The third to sixth multiplied images are images imaged at the same electron multiplication factor. The third multiplied image A1 and the fourth multiplied image B1, and the fifth multiplied image A2 and the sixth multiplied image B2 are preferably imaged at times different from each other (if possible, successive times), and in this case, even if the light amount of the incident light changes, influences of this can be reduced.

In this case, the second step S2 and subsequent steps are as follows. First, in the second step S2, a first luminance average value is calculated based on the added image C1, and a first luminance variance average value is calculated based on the subtracted image D1. In detail, a luminance average value of the pixels (pixel region c10) included in the added image C1 is calculated, and a value obtained by dividing the calculated luminance average value by 2 is used as a luminance average value (first luminance average value) Ia of the pixels included in the first multiplied image AB1. Then, a luminance variance average value of the pixels (pixel region d10) included in the subtracted image D1 is calculated, and a value obtained by dividing the calculated luminance variance average value by 2 is used as a luminance variance average value (first luminance variance average value) Va of the pixels included in the first multiplied image AB1.

Subsequently, in the third step S3, a second luminance average value is calculated based on the added image C2, and a second luminance variance average value is calculated based on the subtracted image D2. In detail, a luminance average value of the pixels (pixel region c20) included in the added image C2 is calculated, and a value obtained by dividing the calculated luminance average value by 2 is used as a luminance average value (second luminance average value) Ib of the pixels included in the second multiplied image AB2. Then, a luminance variance average value of the pixels (pixel region d20) included in the subtracted image D2 is calculated, and a value obtained by dividing the calculated luminance variance average value by 2 is used as a luminance variance average value (second luminance variance average value) Vb of the pixels included in the second multiplied image AB2.

Then, a conversion factor CF is calculated by using the luminance average values Ia and Ib and the luminance variance average values Va and Vb calculated as described above (fourth step S4), and a net electron multiplication factor of the first multiplied image AB1 and the second multiplied image AB2 is calculated (fifth step S5).

Thus, in the first step S1, two multiplied images imaged at times different from each other are acquired as each of the first and second multiplied images, and a luminance average value and a luminance variance average value of pixels included in each of the first and second multiplied images are calculated based on the two multiplied images, and accordingly, accurate luminance average values and luminance variance average values can be obtained. In particular, the luminance variance average value is calculated based on a subtracted image of the two images, so that influences of shading of the subject, lens, and the electron multiplying imaging device 1, etc., are eliminated, and the luminance variance average value becomes an accurate value. Even if the light amounts made incident on the pixels 10 are not uniform, an accurate electron multiplication factor can be obtained.

The method for measuring an electron multiplication factor according to the present embodiment may include, as a step subsequent to the fifth step, a step of adjusting an electron multiplication voltage so that the electron multiplication factor obtained in the fifth step S5 becomes the predetermined electron multiplication factor set in advance when the electron multiplication factor obtained in the fifth step S5 is different from the predetermined electron multiplication factor set in advance (specifically, when the actual electron multiplication factor and the set electron multiplication factor are different from each other).

Alternatively, the method for measuring an electron multiplication factor according to the present embodiment may include, as a step subsequent to the fifth step, a step of correcting luminance values of the multiplied images so that the electron multiplication factor obtained in the fifth step S5 becomes the predetermined electron multiplication factor set in advance when the electron multiplication factor obtained in the fifth step S5 is different from the predetermined electron multiplication factor set in advance.

When the method includes these steps, an actual electron multiplication factor of the solid-state image pickup device 10 can be accurately measured through the first step S1 to the fifth step S5 described above, so that the set value of the electron multiplication factor can be accurately adjusted to the actual electron multiplication factor.

The first multiplied image and the second multiplied image are only required to be different in luminance from each other (that is, there is a predetermined luminance difference between the first multiplied image and the second multiplied image). Therefore, although the light amount of incident light can be changed by using a cap or a shutter as described above, for example, it is also possible that the diaphragm of the optical system (lens) is changed or the exposure time is changed when imaging the first multiplied image and the second multiplied image. In this case, the shading or dimming means such as a cap C becomes unnecessary.

Further, arithmetic operations and storage of the images in the embodiment described above are not limited to those in the CPU 24 or the DSP section 20 but may be in an external arithmetic device or an external storage device such as a PC or an HDD connected to the electron multiplying imaging device 1.

Industrial Applicability

The present invention provides a method for measuring an electron multiplication factor by which an electron multiplication factor can be accurately measured.

Reference Signs List

1 . . . Electron multiplying imaging device, 10 . . . Solid-state image pickup device

The invention claimed is:

1. A method for measuring an electron multiplication factor in an imaging device with an electron multiplying image pickup device, the method comprising:
   acquiring a first multiplied image of incident light with a first light amount and a second multiplied image of incident light with a second light amount different from the first light amount at a predetermined electron multiplication factor set in advance;
   calculating a first luminance average value and a first luminance variance average value of the pixels included in the first multiplied image;
   calculating a second luminance average value and a second luminance variance average value of the pixels included in the second multiplied image;
   calculating a conversion factor of the first multiplied image and the second multiplied image based on the first luminance average value, the first luminance variance average value, the second luminance average value and the second luminance variance average value; and
   obtaining an electron multiplication factor of the first multiplied image and the second multiplied image based on a ratio between a conversion factor at a reference electron multiplication factor and the calculated conversion factor.

2. The method according to claim 1, wherein the obtaining step comprises correcting the obtained electron multiplication factor based on an excess noise factor corresponding to the obtained electron multiplication factor.

3. The method factor according to claim 1, wherein
   the acquiring step comprises acquiring a third multiplied image and a fourth multiplied image of incident light with the first light amount imaged at times different from each other and acquiring a fifth multiplied image and a sixth multiplied image of incident light with the second light amount different from the first light amount imaged at times different from each other,
   the calculating a first luminance average value and a first luminance variance average value step comprises calculating the first luminance average value based on an image obtained by adding the third multiplied image and the fourth multiplied image, and the first luminance variance average value based on an image obtained by subtracting the third multiplied image and the fourth multiplied image, and
   the calculating a second luminance average value and a second luminance variance average value step comprises calculating the second luminance average value based on an image obtained by adding the fifth multiplied image and the sixth multiplied image, and the second luminance variance average value based on an image obtained by subtracting the fifth multiplied image and the sixth multiplied image.

4. The method according to claim 1, further comprising:
   adjusting an electron multiplication voltage so that the obtained electron multiplication factor approaches the predetermined electron multiplication factor set in advance.

5. The method according to claim 1, further comprising:
   correcting a luminance value of the multiplied image so that the obtained electron multiplication factor approaches the predetermined electron multiplication factor set in advance.

* * * * *